United States Patent
Shinotake

(10) Patent No.: US 9,601,416 B2
(45) Date of Patent: Mar. 21, 2017

(54) LEAD FRAME, MOLD AND METHOD OF MANUFACTURING LEAD FRAME WITH MOUNTED COMPONENT

(71) Applicant: SHINDENGEN ELECTRIC MANUFACTURING CO., LTD., Tokyo (JP)

(72) Inventor: Yohei Shinotake, Hanno (JP)

(73) Assignee: Shindengen Electric Manufacturing Co., Ltd., Tokyo (JP)

(*) Notice: Subject to any disclaimer, the term of this patent is extended or adjusted under 35 U.S.C. 154(b) by 35 days.

(21) Appl. No.: 14/442,721

(22) PCT Filed: Dec. 5, 2013

(86) PCT No.: PCT/JP2013/082678
§ 371 (c)(1),
(2) Date: May 13, 2015

(87) PCT Pub. No.: WO2015/083263
PCT Pub. Date: Jun. 11, 2015

(65) Prior Publication Data
US 2016/0293525 A1   Oct. 6, 2016

(51) Int. Cl.
*H01L 23/495* (2006.01)
*H01L 23/31* (2006.01)
*H01L 21/56* (2006.01)

(52) U.S. Cl.
CPC ...... *H01L 23/49541* (2013.01); *H01L 21/565* (2013.01); *H01L 23/3107* (2013.01);
(Continued)

(58) Field of Classification Search
CPC .......... H01L 23/3107; H01L 23/49541; H01L 21/565
(Continued)

(56) References Cited

U.S. PATENT DOCUMENTS 5,835,988 A * 11/1998 Ishii ............... H01L 23/3107
257/666
5,977,613 A * 11/1999 Takata ............... H01L 21/565
257/666
(Continued)

FOREIGN PATENT DOCUMENTS

JP   2-94461    4/1990
JP   5-185467   7/1993
(Continued)

OTHER PUBLICATIONS

International Search Report (ISR) for PCT Patent Application No. PCT/JP2013/082678 dated Mar. 11, 2014.

*Primary Examiner* — Nitin Parekh
(74) *Attorney, Agent, or Firm* — Ladas & Parry, LLP

(57) ABSTRACT

A lead frame includes one metal plate 10 having a terminal 15, and the other metal plate 50 joined to the one metal plate 10, on which a mounted component 91 is placed. The one metal plate 10 includes a first connection portion 11 connected to the terminal 15, a first extension portion 12 disposed on one end of the first connection portion 11, and a second extension portion 13 disposed on the other end of the first connection portion 11. The other metal plate 50 includes a pair of first clamping portions 62 configured to clamp the first extension portion 12, and a pair of second clamping portions 63 configured to clamp the second extension portion 13.

11 Claims, 12 Drawing Sheets

(52) U.S. Cl.
CPC .. *H01L 23/49537* (2013.01); *H01L 23/49531* (2013.01); *H01L 2224/48227* (2013.01); *H01L 2924/00014* (2013.01)

(58) Field of Classification Search
USPC .......................................... 257/666; 438/123
See application file for complete search history.

(56) References Cited

U.S. PATENT DOCUMENTS

| | | | |
|---|---|---|---|
| 6,627,976 B1* | 9/2003 | Chung | H01L 21/565 257/666 |
| 2009/0057855 A1* | 3/2009 | Quinones | H01L 23/49551 257/676 |
| 2012/0300491 A1* | 11/2012 | Hussell | H01L 33/486 362/602 |

FOREIGN PATENT DOCUMENTS

| | | |
|---|---|---|
| JP | 6-216178 | 8/1994 |
| JP | 2001-217271 | 8/2001 |
| JP | 2009-23260 | 2/2009 |
| JP | 2010-129795 | 6/2010 |
| JP | 2012-129392 | 7/2012 |
| JP | 2012-129393 | 7/2012 |
| JP | 5004601 | 8/2012 |

\* cited by examiner

US 9,601,416 B2

LEAD FRAME, MOLD AND METHOD OF MANUFACTURING LEAD FRAME WITH MOUNTED COMPONENT

CROSS-REFERENCE TO RELATED APPLICATION(S)

This application is the U.S. National Stage of International Patent Application No. PCT/JP2013/082678 filed on Dec. 5, 2013, the disclosure of which is hereby incorporated in its entirety by reference.

TECHNICAL FIELD

The present invention relates to a lead frame including one metal plate and the other metal plate joined to the one metal plate, a mold used for manufacturing such a lead frame, and a method of manufacturing a lead frame with a mounted component including such a lead frame.

BACKGROUND ART

It has been conventionally known that a mounted component such as a semiconductor device is placed on a lead frame and the mounted component is sealed with a resin (for example, Patent Document 1). The lead frame on which a mounted component is placed has a terminal like a press-fit terminal. The terminal and the mounted component to be sealed with a resin are connected to each other. Conventionally, a terminal and a location on which a mounted component is placed are formed on a single metal plate.

Patent Document 1: JP2010-129795A

SUMMARY OF THE INVENTION

The inventor of the present invention came up with an idea that one metal plate having a terminal and the other metal plate on which a mounted component is placed are manufactured separately from each other, and the one metal plate and the other metal plate are joined to each other into a single metal plate. However, when two metal plates are joined to each other, there is a problem in that a resin for sealing a mounted component leaks from a joint portion between the two metal plates.

In view of the above circumstances, the present invention provides a lead frame that can prevent leakage of resin as much as possible, a mold used for manufacturing such a lead frame, and a method of manufacturing a lead frame with a mounted component including such a lead frame.

A lead frame according to the present invention comprises:

one metal plate having a terminal; and the other metal plate joined to the one metal plate, on which a mounted component is placed;

wherein:

the one metal plate includes a first connection portion connected to the terminal, a first extension portion disposed on one end of the first connection portion to extend from the first connection portion in a first direction, and a second extension portion disposed on the other end of the first connection portion to extend from the first connection portion in a second direction containing a component opposite to the first direction;

the other metal plate includes a pair of first clamping portions configured to clamp the first extension portion, and a pair of second clamping portions configured to clamp the second extension portion;

each portion of the pair of first clamping portions is pressed to be extended by a mold, which is used for sealing the mounted component with a resin, so that gaps between the first extension portion and the first clamping portions are filled, whereby the resin is prevented from leaking from between the first extension portion and the first clamping portions; and each portion of the pair of second clamping portions is pressed to be extended by the mold, so that gaps between the second extension portion and the second clamping portions are filled, whereby the resin is prevented from leaking from between the second extension portion and the second clamping portions.

In the lead frame according to the present invention, the first extension portion and the first clamping portions may have first positioning structures configured to position the first extension portion and the first clamping portions with each other; and the second extension portion and the second clamping portions may have second positioning structures configured to position the second extension portion and the second clamping portions with each other.

In the lead frame according to the present invention, an end of the first extension portion may be pressed to be extended, so that the first extension portion is positioned with respect to the first clamping portions; and an end of the second extension portion may be pressed to be extended, so that the second extension portion is positioned with respect to the second clamping portions.

In the lead frame according to the present invention, the one metal plate may include a second connection portion connected to the terminal, a third extension portion disposed on one end of the second connection portion to extend from the second connection portion in the first direction, and a fourth extension portion disposed on the other end of the second connection portion to extend from the second connection portion in the second direction; and the other metal plate may include a pair of third clamping portions configured to clamp the third extension portion, and a pair of fourth clamping portions configured to clamp the fourth extension portion.

In the lead frame according to the present invention, the third extension portion and the third clamping portions may have third positioning structures configured to position the third extension portion and the third clamping portions with each other; and the fourth extension portion and the fourth clamping portions may have fourth positioning structures configured to position the fourth extension portion and the fourth clamping portions.

In the lead frame according to the present invention, an end of the third extension portion may be pressed to be extended, so that the third extension portion is positioned with respect to the third clamping portions; and an end of the fourth extension portion may be pressed to be extended, so that the fourth extension portion is positioned with respect to the fourth clamping portions.

In the lead frame according to the present invention, a site, which is pressed by the mold, in one first clamping portion and a site, which is pressed by the mold, in the other first clamping portion may be located to be opposed to each other; and a site, which is pressed by the mold, in one second clamping portion and a site, which is pressed by the mold, in the other second clamping portion may be located to be opposed to each other.

In the lead frame according to the present invention, each portion of the pair of first clamping portions may be pressed to be extended by the mold at sites different from the sites of the pair of first clamping portions at which the resin is prevented from leaking from between the first extension portion and the first clamping portions, so that the first extension portion is positioned with respect to the first clamping portions; and each portion of the pair of second clamping portions may be pressed to be extended by the mold at sites different from the sites of the pair of second clamping portions at which the resin is prevented from leaking from between the second extension portion and the second clamping portions, so that the second extension portion is positioned with respect to the second clamping portions.

In the lead frame according to the present invention, the first direction and the second direction may be perpendicular to a direction in which the terminal is extended.

A mold according to the present invention is a mold used when a resin is provided onto the mounted component on the lead frame described above, the mold comprising:

a pair of first protrusion portions configured to press each portion of the pair of first clamping portions, for preventing that the resin leaks from between the first extension portion and the first clamping portions; and a pair of second protrusion portions configured to press each portion of the pair of second clamping portions, for preventing that the resin leaks from between the second extension portion and the second clamping portions.

A method of manufacturing a lead frame with a mounted component according to the present invention comprises:

joining one metal plate and the other metal plate on which a mounted component is placed, with each other, wherein the one plate includes a terminal, a first connection portion connected to the terminal, a first extension portion disposed on one end of the first connection portion to extend from the first connection portion in a first direction, and a second extension portion disposed on the other end of the first connection portion to extend from the first connection portion in a second direction containing a component opposite to the first direction, and the other metal plate includes a pair of first clamping portions configured to clamp the first extension portion, and a pair of second clamping portions configured to clamp the second extension portion; and sealing the mounted component with a resin by using a mold;

wherein:

in the step of sealing the mounted component with the resin, each portion of the pair of first clamping portions is pressed to be extended by a mold, which is used for sealing the mounted component with the resin, so that gaps between the first extension portion and the first clamping portions are filled, whereby the resin is prevented from leaking from between the first extension portion and the first clamping portions, and each portion of the pair of second clamping portions is pressed to be extended by the mold, so that gaps between the second extension portion and the second clamping portions are filled, whereby the resin is prevented from leaking from between the second extension portion and the second clamping portions.

According to the present invention, each portion of the pair of first clamping portions is pressed to be extended by the mold, which is used for sealing the mounted component with a resin, so that the gaps between the first extension portion and the first clamping portions are filled, whereby the resin supplied into the mold can be prevented from leaking from between the first extension portion and the first clamping portions. In addition, each portion of the pair of second clamping portions is pressed to be extended by the mold, so that the gaps between the second extension portion and the second clamping portions are filled, whereby the resin supplied into the mold can be prevented from leaking from between the second extension portion and the second clamping portions. Therefore, even when the one metal plate and the other metal plate are joined to each other into a single metal plate as in the present invention, the possibility of leaking out of the resin supplied into the mold can be reduced as much as possible.

MODE FOR CARRYING OUT THE INVENTION

First Embodiment

Structure

Herebelow, a lead frame, a mold and a method of manufacturing a lead frame with a mounted component in a first embodiment according to the present invention will be described with reference to the drawings. FIGS. 1 to 8 are views for explaining the first embodiment of the present invention.

Figure 3:
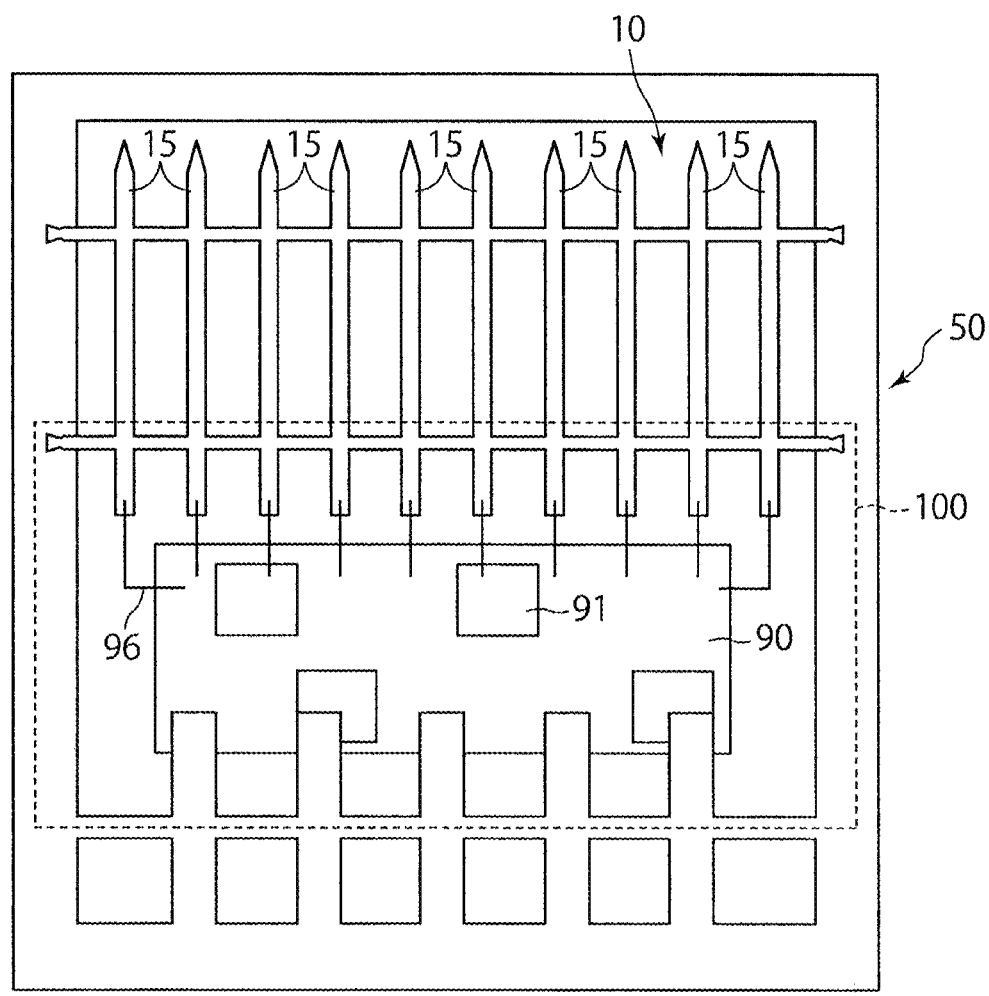
FIG. 3 is an upper plan view showing that a part of a lead frame with a mounted component according to the first embodiment of the present invention is placed in a mold.
Figure 4:
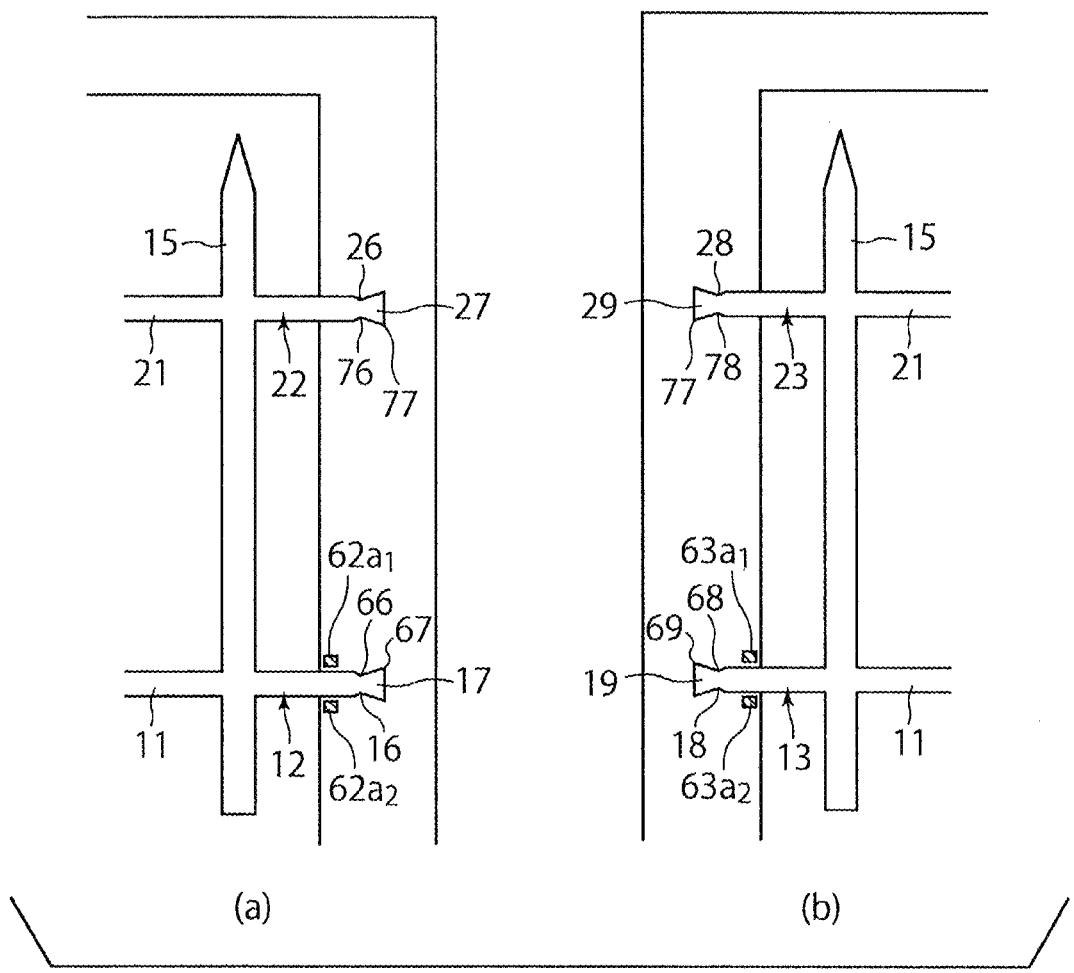
FIGS. 4($a$) and 4($b$) are enlarged upper plan views showing the lead frame according to the first embodiment of the present invention in which a first extension portion is joined to first clamping portions.

As shown in FIG. 3, a lead frame with a mounted component in this embodiment includes: one metal plate 10 having a plurality of terminals 15; and the other metal plate 50 joined to the one metal plate 10, with a mounted component 91, such as an IC chip, being placed thereon. The one metal plate 10 is plated as a whole. As shown in FIG. 3, a mounted substrate 90 on which the mounted component 91 is placed is disposed on the other metal plate 50. In addition, each terminal 15 of the one metal plate 10 and the mounted component 91 or a circuit (not shown) on the mounted plate 90 are connected to each other through a wire 96.

The other metal plate 50 is, for example, a copper plate, while the one metal plate 10 is formed by plating a metal plate made of a phosphorus bronze material. As to a plating for the one metal plate 10, a distal end side of each terminal 15 (upper side in FIG. 1) is plated with a first plating such as a tin plating, and the remaining part is plated with a second plating such as nickel plating. To be more specific, plating is firstly carried out by the second plating such as a nickel plating, and the distal side end of the terminal 15 is then plated with the first plating such as a tin plating.

Figure 1:
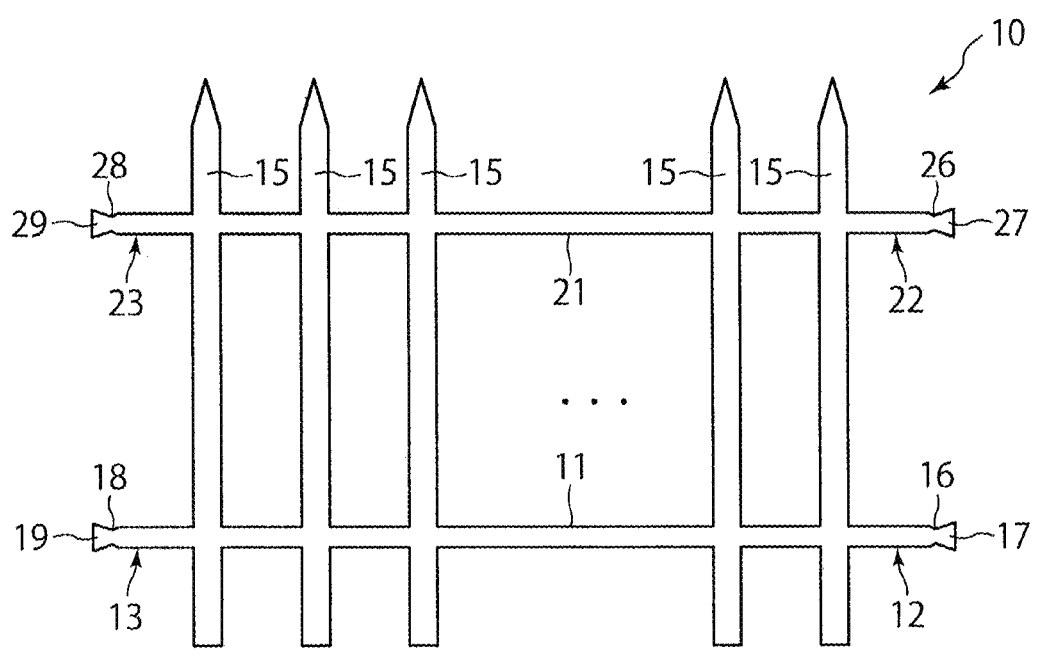
FIG. 1 is a an upper plan view showing one metal plate of a lead frame according to a first embodiment of the present invention.

As shown in FIG. 1, the first metal plate 10 includes a first connection portion 11 that connects the plurality of terminals 15 to each other, a first extension portion 12 disposed on one end of the first connection portion 11 to extend from the first connection portion 11 in a first direction (right direction in FIG. 1), and a second extension portion 13 disposed on the other end of the first connection portion 11 to extend from the first connection portion 11 in a second direction (left direction in FIG. 1) containing a component opposite to the first direction. In this embodiment, although description is made on the assumption that the second direction is opposed to the first direction, it should be noted that this is a mere example. In this embodiment, although description is made on the assumption that each of the first direction and the second direction is perpendicular to a direction in which each terminal 15 is extended (up and down direction in FIG. 1), it should be noted that this is also a mere example.

Figure 2:
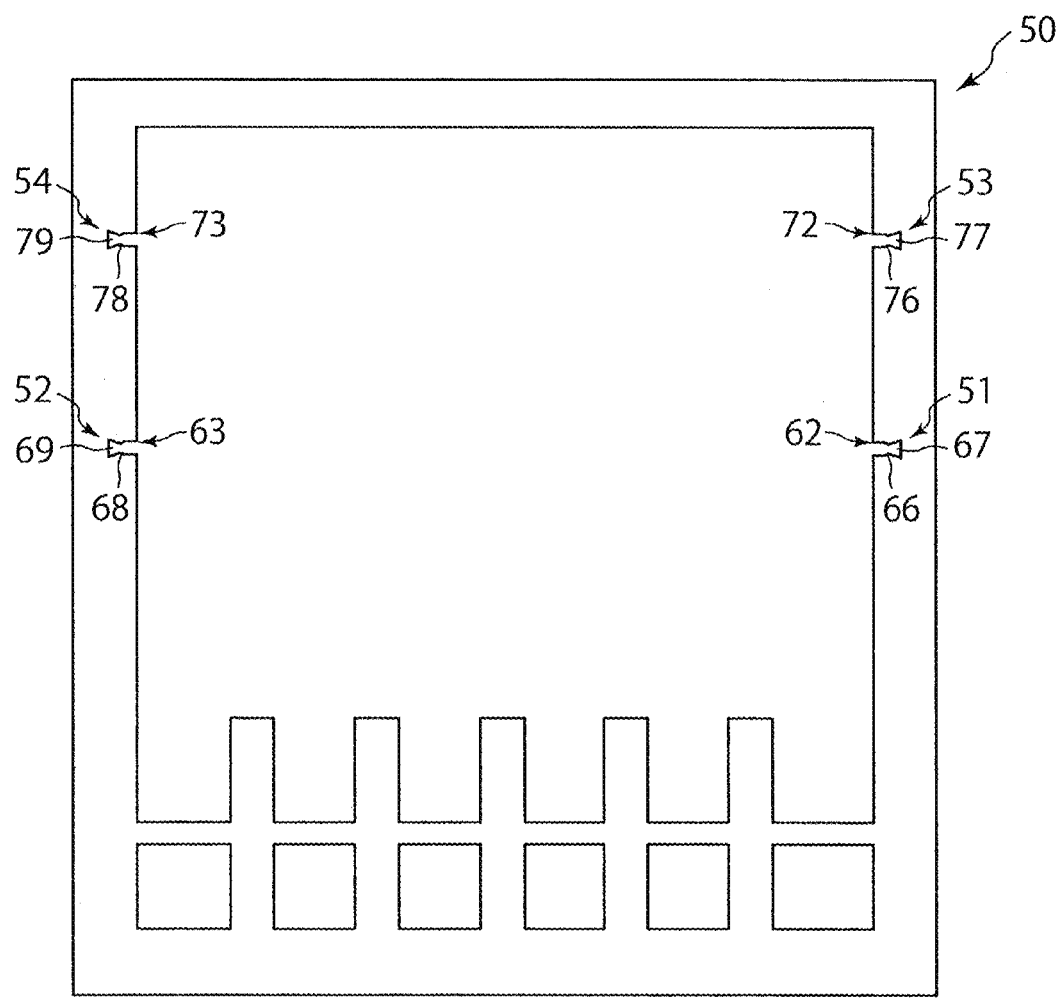
FIG. 2 is an upper plan view showing the other metal plate of the lead frame according to the first embodiment of the present invention.

As shown in FIG. 2, the other metal plate 50 includes a first fitting portion 51 having a pair of first clamping portions 62 configured to clamp the first extension portion 12, and a second fitting portion 52 having a pair of clamping portions 63 configured to clamp the second extension portion 13. In this embodiment, each portion of the pair of first clamping portions 62 is pressed to be extended by a mold 100, which is used for sealing the mounted component 91 with a resin, so that gaps G (see FIG. 6) between the first extension portion 12 and the first clamping portions 62 are filled, whereby the resin is prevented from leaking from between the first extension portion 12 and the first clamping portions 62. Similarly, each portion of the pair of second clamping portions 63 is pressed to be extended by the mold 100, so that gaps G (see FIG. 8) between the second extension portion 13 and the second clamping portions 63 are filled, whereby the resin is prevented from leaking from between the second extension portion 13 and the second clamping portions 63.

As shown in FIGS. 1 and 2, the first extension portion 12 and the first clamping portions 62 have first positioning structures 16 and 66 configured to position the first extension portion 12 and the first clamping portions 62 with each other. Similarly, the second extension portion 13 and the second clamping portions 63 have second positioning structures 18 and 68 configured to position the second extension portion 13 and the second clamping portions 63 with each other. To be more specific, as shown in FIG. 1, the first extension portion 12 has a first narrow portion 16 having a smaller width, and a first wide portion 17 extended from the first narrow portion 16 toward a distal end side and having a larger width than that of the first narrow portion 16. In addition, as shown in FIG. 2, the first fitting portion 51 has a pair of first projection portions 66 disposed on the first clamping portions 62 to correspond to the first narrow portion 16, and a first depression portion 67 corresponding to the first wide portion 17. The first narrow portion 16 is positioned between the pair of first projection portions 66, so that the first extension portion 12 and the first clamping portions 62 are positioned with each other. The second extension portion 13 has a second narrow portion 18 having a smaller width, and a second wide portion 19 extended from the second narrow portion 18 toward a distal end side and having a larger width than that of the second narrow portion 18. In addition, the second fitting portion 52 has a pair of second projection portions 68 disposed on the second clamping portions 63 to correspond to the second narrow portion 18 and a second depression portion 69 corresponding to the second wide portion 19. The second narrow portion 18 is positioned between the pair of second projection portions 68, so that the second extension portion 13 and the second clamping portions 63 are positioned with each other.

In addition, in this embodiment, an end of the first extension portion 12, i.e., the first wide portion 17 is pressed to be extended, so that the first extension portion 12 is positioned with respect to the first clamping portions 62 (see FIGS. 1 and 2). Meanwhile, an end of the second extension portion 13, i.e., the second wide portion 19 is pressed to be extended, so that the second extension portion 13 is positioned with respect to the second clamping portions 63. To be more specific, the first wide portion 17 of the first extension portion 12 is pressed to be horizontally extended, so that the first wide portion 17 comes into contact with the first depression portion 67 of the first fitting portion 51. Thus, the first wide portion 17 of the first extension portion 12 is caulked to the first depression portion 67, so that the first extension portion 12 is positioned with respect to the first clamping portions 62. Similarly, the second wide portion 19 of the second extension portion 13 is pressed to be horizontally extended, so that the second wide portion 19 comes into contact with the second depression portion 69 of the second fitting portion 52. Thus, the second wide portion 19 of the second extension portion 13 is caulked to the second depression portion 69, so that the second extension portion 13 is positioned with respect to the second clamping portions 63.

As shown in FIG. 1, the one metal plate 10 in this embodiment includes a second connection portion 21 connected to the terminals 15, a third extension portion 22 disposed on one end of the second connection portion 21 to extend from the second connection portion 21 in the first direction (right direction in FIG. 1), and a fourth extension portion 23 disposed on the other end of the second connection portion 21 to extend from the second connection portion 21 in the second direction. In addition, as shown in FIG. 2, the other metal plate 50 includes a third fitting portion 53 having a pair of third clamping portions 72 configured to clamp the third extension portion 22, and a fourth fitting portion 54 having a pair of fourth clamping portions 73 configured to clamp the fourth extension portion 23.

As shown in FIGS. 1 and 2, the third extension portion 22 and the third clamping portions 72 have third positioning structures 26 and 76 configured to position the third extension portion 22 and the third clamping portions 72 with each other. Similarly, the fourth extension portion 23 and the fourth clamping portions 73 have fourth positioning structures 28 and 78 configured to position the fourth extension portion 23 and the fourth clamping portions 73 with each other. To be more specific, as shown in FIG. 1, the third extension portion 22 has a third narrow portion 26 having a smaller width, and a third wide portion 27 extended from the third narrow portion 26 toward a distal end side and having a larger width than that of the third narrow portion 26. In addition, as shown in FIG. 2, the third fitting portion 53 has a pair of third projection portions 76 disposed on the third clamping portions 72 to correspond to the third narrow portion 26, and a third depression portion 77 corresponding to the third wide portion 27. The third narrow portion 26 is positioned between the pair of third projection portions 76, so that the third extension portion 22 and the third clamping portions 72 are positioned with each other. Meanwhile, the fourth extension portion 23 has a fourth narrow portion 28 having a smaller width, and a fourth wide portion 29 extended from the fourth narrow portion 28 toward a distal end side and having a lager width than that of the fourth narrow portion 28. The fourth fitting portion 54 has a pair of fourth projection portions 78 disposed on the fourth clamping portions 73 to correspond to the fourth narrow portion 28, and a fourth depression portion 79 corresponding to the fourth wide portion 29. The fourth narrow portion 28 is positioned between the pair of fourth projection portions 78, so that the fourth extension portion 23 and the fourth clamping portions 73 are positioned with each other.

In this embodiment, an end of the third extension portion 22, i.e., so that the third wide portion 27 is pressed to be extended, the third extension portion 22 is positioned with respect to the third clamping portions 72 (see FIGS. 1 and 2). Meanwhile, an end of the fourth extension portion 23, i.e., the fourth wide portion 29 is pressed to be extended, so that the fourth extension portion 23 is positioned with respect to the fourth clamping portions 73. To be more specific, the third wide portion 27 of the third extension portion 22 is pressed to be horizontally extended, so that the third wide portion 27 comes into contact with the third depression portion 77. Thus, the third wide portion 27 of the third extension portion 22 is caulked to the third depression portion 77, so that the third extension portion 22 is positioned with respect to the third clamping portions 72. Similarly, the fourth wide portion 29 of the fourth extension portion 23 is pressed to be horizontally extended, so that the fourth wide portion 29 comes into contact with the fourth depression portion 79. Thus, the fourth wide portion 29 of the fourth extension portion 23 is caulked to the fourth depression portion 79, so that the fourth extension portion 23 is positioned with respect to the fourth clamping portions 73.

In this embodiment, as shown in FIG. 4(a), a site $62a_1$, which is pressed by the mold 100, in one first clamping portion 62 and a site $62a_2$, which is pressed by the mold 100, in the other first clamping portion are located along a straight line extending in a direction in which the terminal 15 is extended (on the straight line extending in the up and down direction in FIG. 1) to be opposed to each other. In addition, as shown in FIG. 4(b), a site $63a_1$, which is pressed by the mold 100, in one second clamping portion 63 and a site $63a_2$, which is pressed by the mold 100, in the other second clamping portion 63 are located along a straight line extending in a direction in which the terminal 15 is extended (on the straight line extending in the up and down direction in FIG. 1) to be opposed to each other.

Figure 5:
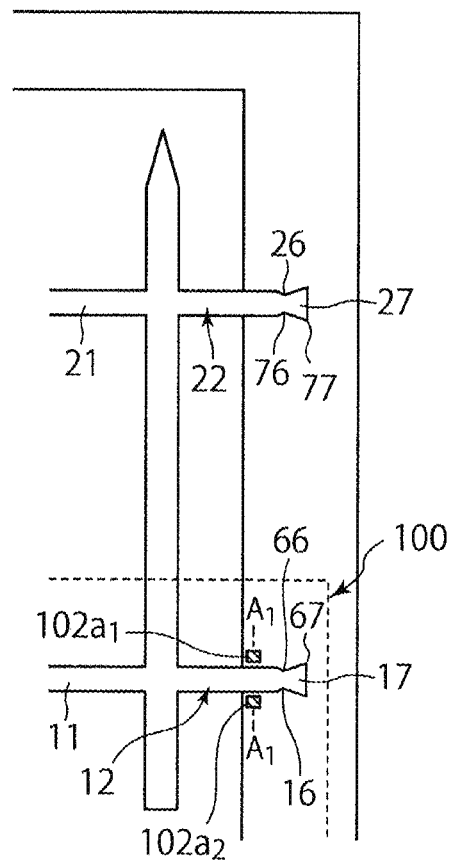
FIG. 5 is an upper plan view corresponding to FIG. 4($a$), showing that a part of the lead frame with a mounted component according to the first embodiment of the present invention is placed in the mold.
Figure 6:
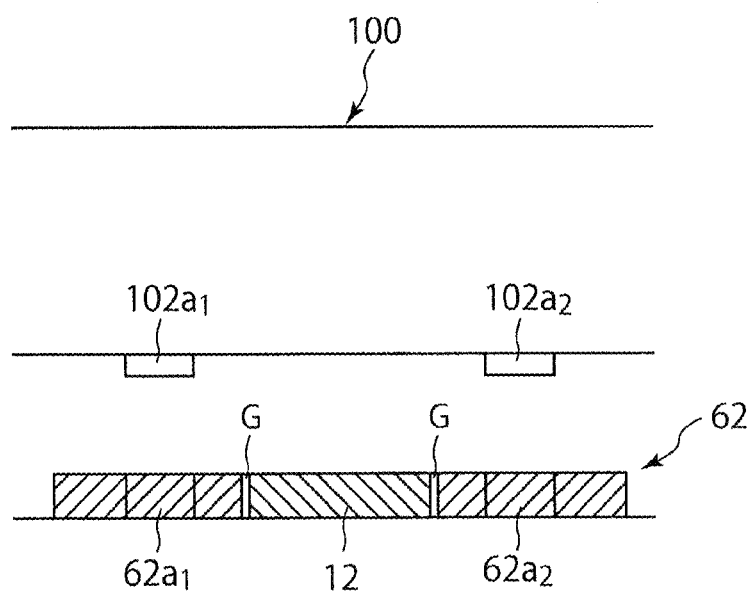
FIG. 6 is a sectional view of FIG. 5 taken along a line $A_1$-$A_1$ of FIG. 5.
Figure 7:
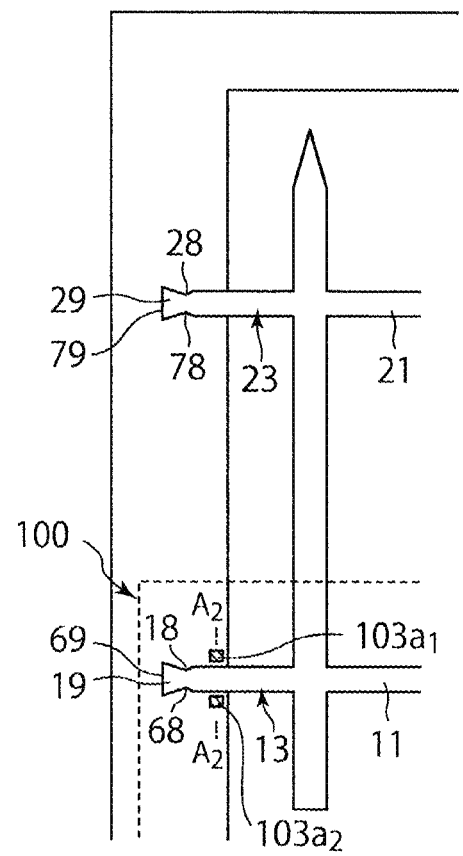
FIG. 7 is an upper plan view corresponding to FIG. 4($b$), showing that a part of the lead frame with a mounted component according to the first embodiment of the present invention is placed in the mold.
Figure 8:
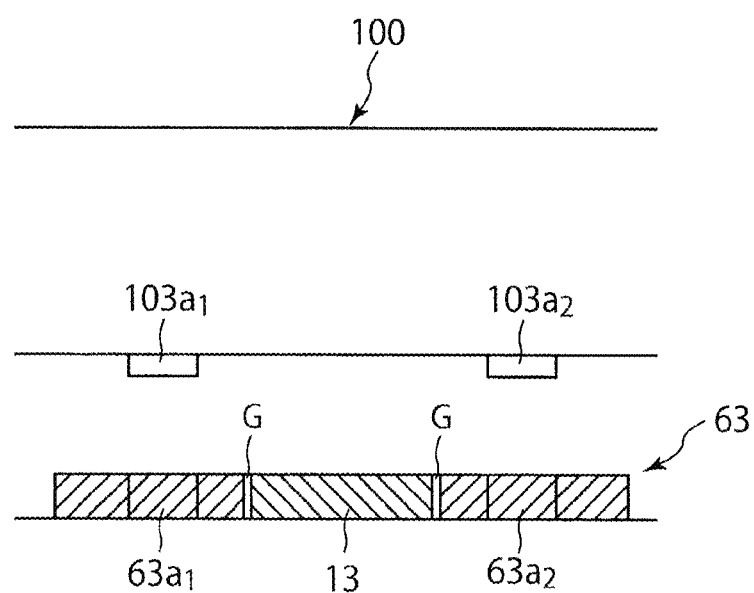
FIG. 8 is a sectional view of FIG. 7 taken along a line $A_2$-$A_2$ of FIG. 7.

As shown in FIGS. 5 to 8, the mold 100, which is used when a resin is provided onto the mounted component 91 placed on the lead frame in this embodiment, has a pair of first protrusion portions $102a_1$ and $102a_2$ configured to press each portion of the pair of first clamping portions 62 and a pair of second protrusion portions $103a_1$ and $103a_2$ configured to press each portion of the pair of second clamping portions 63. To be more specific, as shown in FIG. 6, the predetermined site $62a_1$ of the one first clamping unit 62 is pressed by the one first protrusion portion $102a_1$, and the predetermined side $62a_2$ of the other first clamping portion 62 is pressed by the other first protrusion portion $102a_2$. In addition, as shown in FIG. 8, a predetermined site $63a_1$ of the one second clamping portion 63 is pressed by one second protrusion portion $103a_1$, and a predetermined site $63a_2$ of the other second clamping portion 63 is pressed by the other second protrusion portion $103a_2$.

<<Manufacturing Method>>

There is explained a method of manufacturing a lead frame with a mounted component including the mounted component 91 sealed with a resin, with the sue of the one metal plate 10 and the other metal plate 50.

Firstly, the one metal plate 10, which is plated as a whole, and the other metal plate 50 are prepared. In this embodiment, at this time, the one metal plate 10 is plated as a whole, and the mounted substrate 90 on which the mounted component 91 is placed is joined to the other metal plate 50.

Then, the first extension portion 12 is positioned between the pair of first clamping portions 62, the second extension portion 13 is positioned between the pair of second clamping portions 63, the third extension portion 22 is positioned between the pair of third clamping portions 72, and the fourth extension portion 23 is positioned between the pair of fourth clamping portions 73 (see FIGS. 1 and 2).

Then, the first wide portion 17 of the first extension portion 12 is pressed to be extended so that the first wide portion 17 is caulked to the first depression portion 67, whereby the first extension portion 12 is positioned with respect to the first clamping portions 62. The second wide portion 19 of the second extension portion 13 is pressed to be extended so that the second wide portion 19 is caulked to the second depression portion 69, whereby the second extension portion 13 is positioned with respect to the second clamping portions 63. The third wide portion 27 of the third extension portion 22 is pressed to be extended so that the third wide portion 27 is caulked to the third depression portion 77, whereby the third extension portion 22 is positioned with respect to the third clamping portions 72. The fourth wide portion 29 of the fourth extension unit 23 is pressed to be extended so that the fourth wide portion 29 is caulked to the fourth depression portion 79, whereby the fourth extension portion 23 is positioned with respect to the fourth clamping portions 73.

In this embodiment, as described above, the respective extension portions 12, 13, 22 and 23 are positioned between the respective clamping portions 62, 63, 72 and 73, and the respective extension portions 12, 13, 22 and 23 are caulked to the respective depression portions 67, 69, 77 and 79, whereby the one metal plate 10 is positioned with respect to the other metal plate 50.

Then, the first extension portion 12 is welded to the first fitting portion 51 by laser, for example. The second extension portion 13 is welded to the second fitting portion 52 by laser, for example. The third extension portion 22 is welded to the third fitting portion 53 by laser, for example. The fourth extension portion 23 is welded to the fourth fitting portion 54 by laser, for example. As a result, the one metal plate 10 is joined to the other plate 50.

Then, each of the terminals 15 of the one metal plate 10 and the mounted component 91 or a circuit (not shown) on the mounted substrate 90 are connected to each other through the wire 96.

Then, the mounted component 91 on the lead frame is surrounded by the mold 100 (see FIG. 3). At this time, the predetermined sites $62a_1$ and $62a_2$ of the pair of first clamping portions 62 is pressed to be extended by the first protrusion portions $102a_1$ and $102a_2$ of the mold 100, so that the gaps G between the first extension portion 12 and the first clamping portions 62 are filled (see FIGS. 5 and 6). Similarly, the predetermined sites $63a_1$ and $63a_2$ of the pair of second clamping portions 63 is pressed to be extended by the pair of second protrusion portions $103a_1$ and $103a_2$ of the mold 100, so that the gaps G between the second extension portion 13 and the second clamping portions 63 are filled (see FIGS. 7 and 8).

Then, a resin is supplied into the mold 100, so that the mounted component 91 is sealed with the resin. At this time, as described above, the predetermined sites $62a_1$ and $62a_2$ of the pair of first clamping portions 62 is pressed to be extended by the pair of first protrusion portions $102a_1$ and $102a_2$ of the mold 100, so that the gaps G between the first extension portion 12a and the first clamping portions 62 are filled. Thus, the supplied resin is prevented from leaking out from between the first extension portion 12 and the first clamping portions 62 (see FIGS. 5 and 6). Similarly, the predetermined sites $63a_1$ and $63a_2$ of the pair of second clamping portions 63 is pressed to be extended by the pair of second protrusion portions $103a_1$ and $103a_2$ of the mold 100, so that the gaps G between the second extension portion 13 and the second clamping portions 63 are filled. Thus, the supplied resin is prevented from leaking out from between the second extension portion 13 and the second clamping portions 63 (see FIGS. 7 and 8).

Then, the resin supplied into the mold 100 is cured, whereby the lead frame with a mounted component including the resin-sealed mounted component 91 is completed. After the resin has been cured, the mold 100 is removed.

<<Effect>>

Next, there is explained an effect achieved by the above-structured embodiment, the effect not being yet stated or being particularly important.

Firstly, there is explained an effect related to the lead frame obtained by joining the one metal plate 10 and the other metal plate 50 with each other.

In general, an electric conductivity and an elastic modulus are reversely correlated to each other. Namely, a copper material having a high electric conductivity has a low elastic modulus, while a copper material having a high elastic modulus and a spring property has a low electric conductivity. Thus, in a conventional lead frame made of one material, it is difficult to have both a high electric conductivity and a high elastic modulus.

Therefore, the inventor of the present invention came up with an idea that two kinds of metal plates made of different materials, which are joined to each other by laser welding, is used as a lead frame. The metal plates are plated. However, there is a problem in that, in the case where the plated metal plates are used, when the plated metal plates are reflown (subjected to a reflow soldering), the plating is re-melted. When the plating is re-melted, a base metal may be exposed and/or a metal surface may have irregularities, which invites defective mounting.

On the other hand, according to this embodiment, the one metal plate 10 is plated, and the mounted component 91, such as an IC chip, is reflow-soldered to the other metal plate 50. Only the other metal plate 50 is reflown and thus it is not necessary to reheat the one plated metal plate 10 so as to re-melt the plating. Thus, the re-melting of the plating of the one metal plate 10 can be avoided, whereby the defective mounting can be prevented from occurring.

In order that the lead frame is plated as a whole, it can be considered that a lead frame wound in a roll is fed out and immersed in a plating liquid such that the lead frame is plated, and that the plated lead frame is wound in a roll again. However, since the lead frame is wound in a roll, the overall lead frame may be bent (coil set occurs) so that defective assemblage during manufacturing steps occurs and/or that size precision of a completed product is deteriorated. On the other hand, according to this embodiment, since only the one metal plate 10 is plated and the other metal plate 50 is not plated, disadvantage caused by bending can be reduced as much as possible. In addition, since only the one metal plate 10 is bent, it does not take a lot of time and effort to straighten the bending.

In addition, when the terminal 15, such as a press fit pin, is disposed on a distal end of the lead frame, a strict positioning precision is required for a distal end of the terminal 15. In this case, a more strict size precision is required. In this regard, according to this embodiment, the one metal plate 10 is positioned with respect to the other plate 50 by various methods described below. Thus, according to this embodiment, a requirement for strict size precision can be satisfied.

In addition, according to this embodiment, each portion of the pair of clamping portions 62 is pressed to be extended by the mold 100, which is used for sealing the mounted component 91 with a resin, so that the gaps G between the first extension portion 12 and the first clamping portions 62 are filled, whereby the resin supplied into the mold 100 is prevented from leaking from between the first extension portion 12 and the first clamping portions 62 (see FIGS. 5 and 6). In addition, each portion of the pair of second clamping portions 63 is pressed to be extended by the mold 100, so that the gaps between the second extension portion 13 and the second clamping portions 63 are filled, whereby the resin supplied into the model 100 is prevented from leaking from between the second extension portion 13 and the second clamping portions 63 (see FIGS. 7 and 8). Thus, as in this embodiment, even when the one plated metal plate 10 having the terminals 15 and the other metal plate 50 on which the mounted component 91 is placed are manufactured separately from each other, and the one metal plate 10 and the other metal plate 50 are joined to each other into a single metal plate, the possibility of leaking out of the resin supplied into the mold 100 can be reduced as much as possible.

It is preferable that an amount of extension of the one first clamping portion 62 and an amount of extension of the other first clamping portion 62 are equal to each other. In addition, it is preferable that an amount of extension of the one second clamping portion 63 and an amount of extension of the other second clamping portion 63 are equal to each other. This is because, according to this aspect, occurrence of shifting in the direction in which the terminal 15 is extended (up and down direction in FIG. 3) of the one metal plate 10 with respect to the other metal plate 50 can be prevented.

In addition, instead of pressing and extending the pair of first clamping portions 62 and the pair of second clamping portions 63 by the mold 100, it can be considered that the first extension portion 12 and the second extension portion 13 are pressed to be extended by the mold 100. However, in this embodiment, the first wide portion 17 of the first extension portion 12 is pressed to be extended to come into contact with the first depression portion 67, so that the first wide portion 17 of the first extension portion 12 is caulked to the first depression portion 67. Similarly, the second wide portion 19 of the second extension portion 13 is pressed to be extended to come into contact with the second depression portion 69, so that the second wide portion 19 of the second extension portion 13 is caulked to the second depression portion 69. As a result, the respective first extension portion 12 and the second extension portion 13 do not have sufficient thicknesses to be further extended by the mold 100. Thus, as in this embodiment, it is preferable that the pair of first clamping portions 62 and the pair of second clamping portions 63 is pressed to be extended by the mold 100.

According to this embodiment, the first extension portion 12 and the first clamping portions 62 have the first positioning structures 16 and 66 configured to position the first extension portion 12 and the first clamping portion 62 with each other, and the second extension portion 13 and the second clamping portions 63 have the second positioning structures 18 and 68 configured to position the second extension portion 13 and the second clamping portions 63 with each other (see FIGS. 1 and 2). Thus, the one metal plate 10 can be positioned with respect to the other metal plate 50 at both ends of the one metal plate 10.

In this embodiment, the first narrow portion 16 is positioned between the pair of first projection portions 66, so that the first extension portion 12 and the first clamping portions 62 are positioned with each other. The second narrow portion 18 is positioned between the pair of second projection portions 68, so that the second extension portion 13 and the second clamping portions 63 are positioned with each other. Thus, the one metal plate 10 can be positioned with respect to the other metal plate 50 by a simple manner.

In this embodiment, the first wide portion 17 of the first extension portion 12 is pressed to be extended, so that the first extension portion 12 is positioned with respect to the first clamping portions 62. The second wide portion 19 of the second extension portion 13 is pressed to be extended, so that the second extension portion 13 is positioned with respect to the second clamping portions 63. Thus, the one metal plate 10 is more precisely positioned with respect to the metal plate 50 at both ends of the one metal plate 10.

Further, in this embodiment, the third extension portion 22 and the third clamping portions 72 have the third positioning structures 26 and 76 configured to position the third extension portion 22 and the third clamping portions 72 with each other, and the fourth extension portion 23 and the fourth clamping portions 73 have the fourth positioning structures 28 and 78 configured to position the fourth extension portion 23 and the fourth clamping portions 73 with each other (see FIGS. 1 and 2). Thus, since the one metal plate 10 can be positioned with respect to the other metal plate 50 at four corners of the one metal plate 10, the precise positioning can be expected.

In addition, the third narrow portion 26 is positioned between the third projection portions 76, so that the third extension portion 22 and the third clamping portions 72 are positioned with each other, and the fourth narrow portion 28 is positioned between the pair of fourth projection portions 78, so that the fourth extension portion 23 and the fourth clamping portions 73 are positioned with each other. Thus, the one metal plate 10 can be positioned with respect to the other metal plate 50 in a simple manner.

In this embodiment, the third wide portion 19 of the third extension portion 22 is pressed to be extended, so that the third extension portion 22 is positioned with respect to the third clamping portions 72. The fourth wide portion 29 of the fourth extension portion 23 is pressed to be extended, so that the fourth extension portion 23 is positioned with respect to the fourth clamping portions 73. Thus, since the one metal plate 10 can be positioned with respect to the other metal plate 50 at four corners of the one metal plate 10, further precise positioning can be expected.

In addition, in this embodiment, the site $62a_1$, which is pressed by the mold 100, in the one first clamping portion 62 and the site $62a_2$, which is pressed by the mold 100, in the other first clamping portion 62 are located along a straight line extending in a direction in which the terminal 15 is extended, to be opposed to each other (see FIG. 4(a)). Meanwhile, the site $63a_1$, which is pressed by the mold 100, in the one second clamping portion 63 and the site $63a_2$, which is pressed by the mold 100, in the other second clamping portion 63 are located along a straight line extending in a direction in which the terminal 15 is extended, to be opposed to each other (see FIG. 4(b)). Thus, when the first clamping portions 62 are pressed by the mold 100, it can be prevented that the first extension portion 12 is rotated with respect to the first clamping portions 62. At the same time, when the second clamping portions 63 is pressed by the mold 100, it can be prevented that the second extension portion 13 is rotated with respect to the second clamping portions 63.

This point is explained. The site $62a_1$, which is pressed by the mold 100, in the one first clamping portion 62 and the site $62a_2$, which is pressed by the mold 100, in the other first clamping portion 62 are located along a straight line extending in a direction in which the terminal 15 is extended, to be opposed to each other. Thus, a force applied to the first extension portion 12 from the one first clamping portion 62 and a force applied to the first extension portion 12 from the other first clamping portion 62 are opposed to each other. As a result, a force for rotating the first extension portion 12 with respect to the first clamping portions 62 does not work. Similarly, the site $63a_1$, which is pressed by the mold 100, in the one second clamping portion 63 and the site $63a_2$, which is pressed by the mold 100, in the other second clamping portion 63 are located along a straight line extending in a direction in which the terminal 15 is extended, to be opposed to each other. Thus, a force applied to the second extension portion 13 from the one second clamping portion 63 and a force applied to the second extension portion 13 from the other second clamping portion 63 are opposed to each other. As a result, a force for rotating the second extension portion 13 with respect to the second clamping portions 63 does not work. For this reason, when the first clamping portions 62 are pressed by the mold 100, it can be prevented that the first extension portion 12 is rotated with respect to the first clamping portions 62. At the same time, when the second clamping portions 63 is pressed by the mold 100, it can be prevented that the second extension portion 13 is rotated with respect to the second clamping portions 63.

Second Embodiment

Next, a second embodiment of the present invention will be described herebelow with reference to FIGS. 9 to 14.

In the first embodiment, the first clamping portions 62 and the second clamping portions 63 are pressed by using the mold 100 having the pair of first protrusion portions $102a_1$ and $102a_2$ and the pair of second protrusion portions $103a_1$ and $103a_2$. On the other hand, in the second embodiment, a mold 100, which has a pair of first auxiliary protrusion portions $102b_1$ and $102b_2$ for positioning and a pair of second auxiliary protrusion portions $103b_1$ and $103b_2$ for positioning, in addition to the pair of first protrusion portions $102a_1$ and $102a_2$ and the pair of second protrusion portions $103a_1$ and $103a_2$, is used. Lower ends of the pair of first auxiliary protrusion portions $102b_1$ and $102b_2$ are located below lower ends of the pair of first protrusion portions $102a_1$ and $102a_2$ (see FIGS. 10 and 11). Lower ends of the pair of second auxiliary protrusion portions $103b_1$ and $103b_2$ are located below lower ends of the pair of second protrusion portions $103a_1$ and $103a_2$ (see FIGS. 13 and 14). Thus, after the first auxiliary protrusion portions $102b_1$ and $102b_2$ and the second auxiliary protrusion portions $103b_1$ and $103b_2$ respectively have pressed the pair of first clamping portions 62 and the pair of second clamping portions 63, the pair of first protrusion portions $102a_1$ and $102a_2$ and the pair of second protrusion portions $103a_1$ and $103a_2$ respectively press the pair of first clamping portions 62 and the pair of second clamping portions 63.

Figure 9:
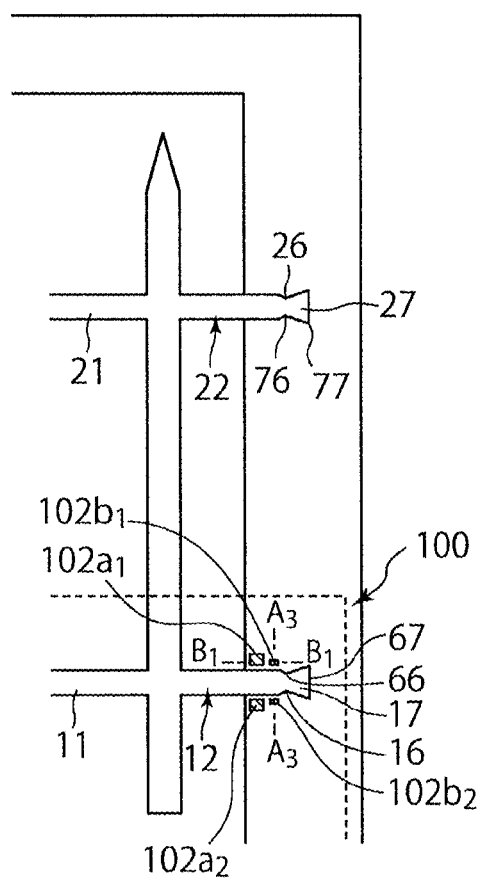
FIG. 9 is an enlarged upper plan view showing the lead frame according to a second embodiment of the present invention in which a first extension portion is jointed to the first clamping portions, and a part of the lead frame with a mounted component is paled in a mold.
Figure 11:
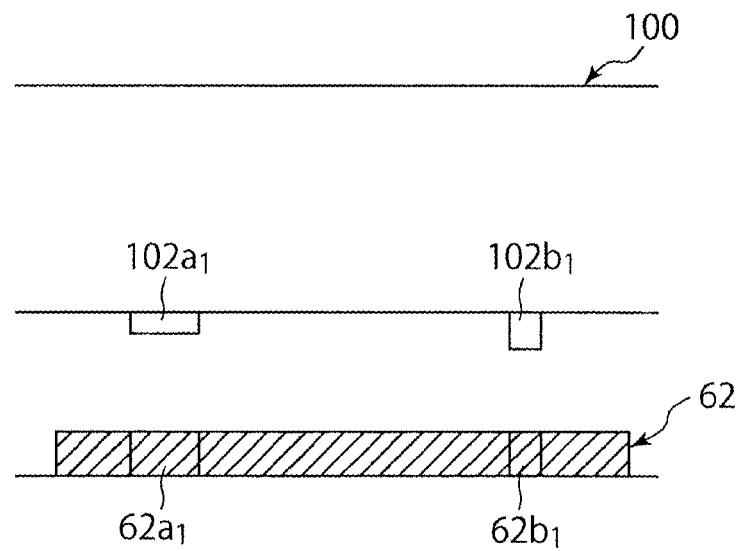
FIG. 11 is a sectional view of FIG. 9 taken along a line $B_1$-$B_1$ of FIG. 9.
Figure 12:
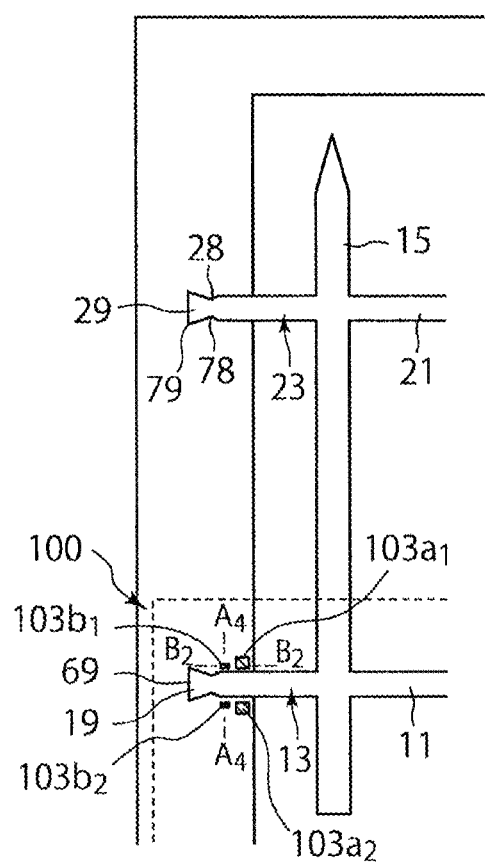
FIG. 12 is an enlarged upper plan view showing the lead frame according to the second embodiment of the present invention in which a second extension portion is jointed to second clamping portions, and a part of the lead frame with a mounted component is paled in a mold.
Figure 13:
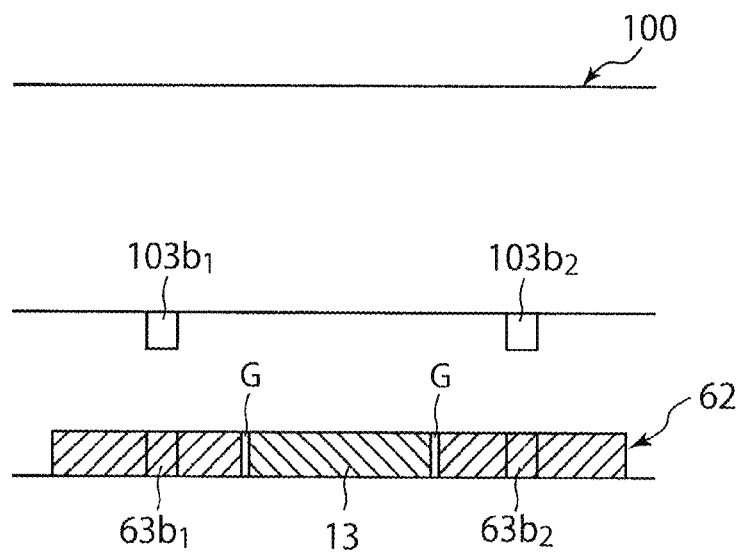
FIG. 13 is a sectional view of FIG. 12 taken along a line $A_4$-$A_4$ of FIG. 12.
Figure 14:
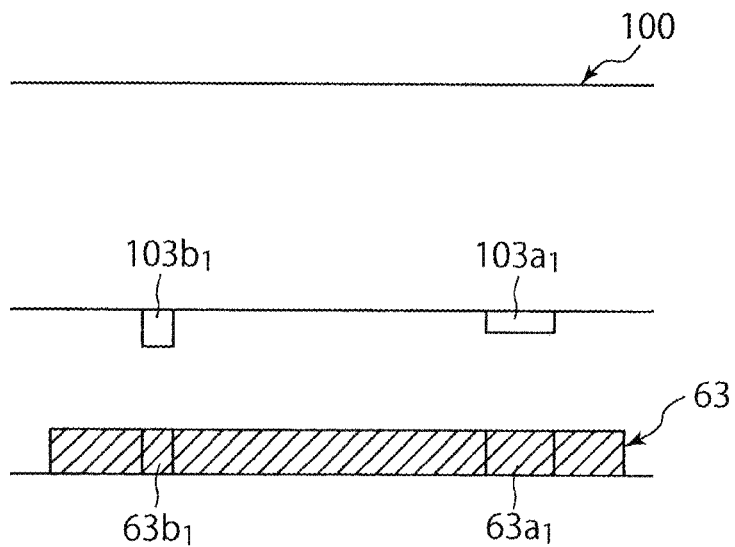
FIG. 14 is a sectional view of FIG. 12 taken along a line $B_2$-$B_2$ of FIG. 12.

As shown in FIGS. 9 and 11, since a sectional area of the first auxiliary protrusion portions $102b_1$ and $102b_2$ is smaller than a sectional area of the first protrusion portions $102a_1$ and $102a_2$, a deformation amount of the first clamping portions 62 by the first auxiliary protrusion portions $102b_1$ and $102b_2$ is smaller than a deformation amount of the first clamping portions 62 by the first protrusion portions $102a_1$ and $102a_2$. As shown in FIGS. 12 and 14, since a sectional area of the second auxiliary protrusion portions $103b_1$ and $103b_2$ is smaller than a sectional area of the second protrusion portions $103a_1$ and $103a_2$, a deformation amount of the second clamping portions 63 by the second auxiliary protrusion portions $103b_1$ and $103b_2$ is smaller than a deformation amount of the second clamping portions 62 by the second protrusion portions $103a_1$ and $103a_2$.

In the second embodiment, other structures are substantially the same as those of the first embodiment. In the second embodiment, the same portions as those of the first embodiment are shown by the same reference numbers, and detailed description thereof is omitted.

Also in this embodiment, the same effects as that of the first embodiment can be expected. Since these effects are described in detail in the first embodiment, only effects inherent to this embodiment are described.

According to this embodiment, before each portion of the pair of first clamping portions 62 is pressed by the pair of first protrusion portions $102a_1$ and $102a_2$ of the mold 100, and each portion of the pair of second clamping portions 63 is pressed by the pair of second protrusion portions $103a_1$ and $103a_2$ of the mold 100, the pair of first auxiliary protrusion portions $102b_1$ and $102b_2$ and the pair of second auxiliary protrusion portions $103b_1$ and $103b_2$ respectively press the pair of first clamping portions 62 and the pair of second clamping portions 63. Thus, each portion of the pair of first clamping portions 62 is pressed to be extended by the first auxiliary protrusion portions $102b_1$ and $102b_2$ so that the first extension portion 12 is positioned with respect to the first clamping portions 62. In addition, each portion of the pair of second clamping portions 63 is pressed to be extended by the second auxiliary protrusion portions $103b_1$ and $103b_2$, so that the second extension portion 13 is positioned with respect to the second clamping portions 63. Thus, before the first clamping portions 62 and the second clamping portions 63 are pressed by the first protrusion portions $102a_1$ and $102a_2$ of the mold 100 and the second protrusion portions $103a_1$ and $103a_2$ of the mold 100, the one metal plate 10 can be positioned with respect to the other metal plate 50. As a result, when the other metal plate 50 is pressed by the mold 100, shifting of the position of the one metal plate 10 with respect to the other meal plate 50 can be more reliably prevented.

Figure 10:
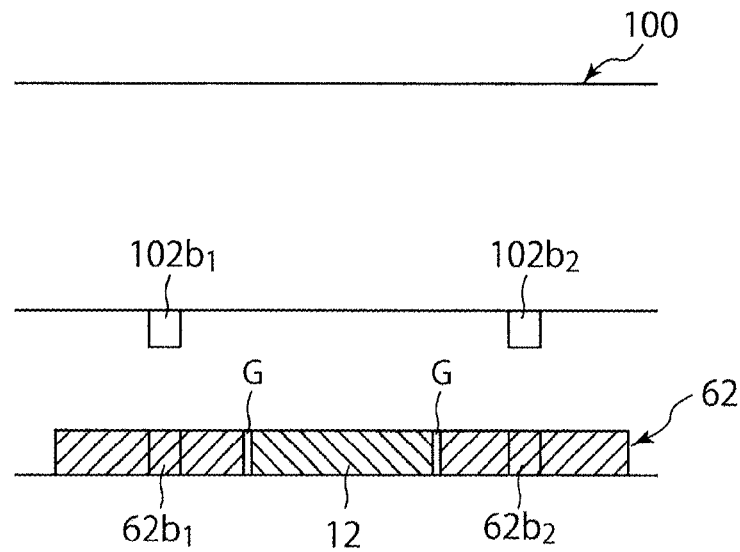
FIG. 10 is a sectional view of FIG. 9 taken along a line $A_3$-$A_3$ of FIG. 9.

A site $62b_1$, which is pressed by the first auxiliary protrusion portion $102b_1$ of the mold 100, in the one clamping portion 62, and a site $62b_2$, which is pressed by the first auxiliary protrusion portion $102b_2$ of the mold 100, in the other first clamping portion 62 are located along a straight line in which the terminal 15 is extended, to be opposed to each other (see FIGS. 9 and 10). Thus, a force applied to the first extension portion 12 from the one first clamping portion 62 and a force applied to the first extension portion 12 from the other first clamping portion 62 are opposed to each other. Thus, a force for rotating the first extension portion 12 with respect to the first clamping portions 62 does not work. A site $63b_1$, which is pressed by the second auxiliary protrusion portion $103b_1$ of the mold 100, in the one second clamping portion 63 and a site $63b_2$, which is pressed by the second auxiliary protrusion portion $103b_2$ of the mold 100, in the other second clamping portion 63 are located along a straight line in which the terminal 15 is extended, to be opposed to each other (see FIGS. 12 and 13). Thus, a force applied to the second extension portion 13 from the one second clamping portion 63 and a force applied to the second extension portion 13 from the other second clamping portion 63 are opposed to each other. Thus, a force for rotating the second extension portion 13 with respect to the second clamping portions 63 does not work. As a result, it can be prevented that the first extension portion 12 is rotated with respect to the first clamping portions 62, and that the second extension portion 13 is rotated with respect to the second clamping portions 63.

Finally, the aforementioned description of the respective embodiments and disclosure of the drawings are mere example for explaining the invention recited in the claims. The invention recited in the claims should not be limited by the aforementioned description of the respective embodiments and disclosure of the drawings.

10 One metal plate
11 First connection portion
12 First extension portion
13 Second extension portion
15 Terminal
16 First positioning structure
18 Second positioning structure
21 Second connection portion
22 Third extension portion
23 Fourth extension portion
26 Third positioning structure
28 Fourth positioning structure
50 Other metal plate
62 First clamping portion
63 Second clamping portion
66 First positioning structure
68 Second positioning structure
72 Third clamping portion
73 Fourth clamping portion
76 Third positioning structure
78 Fourth positioning structure
91 Mounted component
100 Mold
$102a_1$, $102a_2$ First protrusion portion
$102b_1$, $102b_2$ First auxiliary protrusion portion 103$a_1$, 103$a_2$ Second protrusion portion
103$b_1$, 103$b_2$ Second auxiliary protrusion portion

The invention claimed is:

1. A lead frame comprising:
one metal plate having a plurality of terminals; and
the other metal plate joined to the one metal plate, on which a mounted component is wire bonded to the respective terminal;
wherein:
the one metal plate includes a first connection portion connected to the respective terminal, a first extension portion disposed on one end of the first connection portion to extend from the first connection portion in a first direction, and a second extension portion disposed on the other end of the first connection portion to extend from the first connection portion in a second direction opposite to the first direction;
the other metal plate includes a pair of first clamping portions configured to clamp the first extension portion, and a pair of second clamping portions configured to clamp the second extension portion;
each portion of the pair of first clamping portions is pressed to be extended by a mold, which is used for sealing the mounted component with a resin, so that gaps between the first extension portion and the first clamping portions are filled, whereby the resin is prevented from leaking between the first extension portion and the first clamping portions; and
each portion of the pair of second clamping portions is pressed to be extended by the mold, so that gaps between the second extension portion and the second clamping portions are filled, whereby the resin is prevented from leaking between the second extension portion and the second clamping portions.

2. The lead frame according to claim 1, wherein:
the first extension portion and the first clamping portions have first positioning structures configured to position the first extension portion and the first clamping portions with each other; and
the second extension portion and the second clamping portions have second positioning structures configured to position the second extension portion and the second clamping portions with each other.

3. The lead frame according to claim 1, wherein:
an end of the first extension portion is pressed to be extended, so that the first extension portion is positioned with respect to the first clamping portions; and
an end of the second extension portion is pressed to be extended, so that the second extension portion is positioned with respect to the second clamping portions.

4. The lead frame according to claim 1, wherein:
the one metal plate includes a second connection portion connected to the respective terminal, a third extension portion disposed on one end of the second connection portion to extend from the second connection portion in the first direction, and a fourth extension portion disposed on the other end of the second connection portion to extend from the second connection portion in the second direction; and
the other metal plate includes a pair of third clamping portions configured to clamp the third extension portion, and a pair of fourth clamping portions configured to clamp the fourth extension portion.

5. The lead frame according to claim 4, wherein:
the third extension portion and the third clamping portions have third positioning structures configured to position the third extension portion and the third clamping portions with each other; and
the fourth extension portion and the fourth clamping portions have fourth positioning structures configured to position the fourth extension portion and the fourth clamping portions.

6. The lead frame according to claim 4, wherein:
an end of the third extension portion is pressed to be extended, so that the third extension portion is positioned with respect to the third clamping portions; and
an end of the fourth extension portion is pressed to be extended, so that the fourth extension portion is positioned with respect to the fourth clamping portions.

7. The lead frame according to claim 1, wherein;
a site, which is pressed by the mold, in one first clamping portion and a site, which is pressed by the mold, in the other first clamping portion are located to be opposed to each other; and
a site, which is pressed by the mold, in one second clamping portion and a site, which is pressed by the mold, in the other second clamping portion are located to be opposed to each other.

8. The lead frame according to claim 1, wherein:
each portion of the pair of first clamping portions is pressed to be extended by the mold at sites different from the sites of the pair of first clamping portions at which the resin is prevented from leaking between the first extension portion and the first clamping portions, so that the first extension portion is positioned with respect to the first clamping portions; and
each portion of the pair of second clamping portions is pressed to be extended by the mold at sites different from the sites of the pair of second clamping portions at which the resin is prevented from leaking between the second extension portion and the second clamping portions, so that the second extension portion is positioned with respect to the second clamping portions.

9. The lead frame according to claim 1, wherein
the first direction and the second direction are perpendicular to a direction in which the plurality of terminals are extended.

10. The lead frame according to claim 1, wherein the mold comprises:
a pair of first protrusion portions configured to press each portion of the pair of first clamping portions, for preventing the resin leaks between the first extension portion and the first clamping portions; and
a pair of second protrusion portions configured to press each portion of the pair of second clamping portions, for preventing the resin leaks between the second extension portion and the second clamping portions.

11. A method of manufacturing a lead frame with a mounted component, comprising steps of:
joining one metal plate having a plurality of terminals and the other metal plate on which a mounted component is wire bonded to the respective terminal, a first connection portion connected to the respective terminal, a first extension portion disposed on one end of the first connection portion to extend from the first connection portion in a first direction, and a second extension portion disposed on the other end of the first connection portion to extend from the first connection portion in a second direction opposite to the first direction, and the other metal plate includes a pair of first clamping portions configured to clamp the first extension portion, and a pair of second clamping portions configured to clamp the second extension portion; and sealing the mounted component with a resin by using a mold;

wherein:

in the step of sealing the mounted component with the resin, each portion of the pair of first clamping portions is pressed to be extended by a mold, which is used for sealing the mounted component with the resin, so that gaps between the first extension portion and the first clamping portions are filled, whereby the resin is prevented from leaking between the first extension portion and the first clamping portions, and each portion of the pair of second clamping portions is pressed to be extended by the mold, so that gaps between the second extension portion and the second clamping portions are filled, whereby the resin is prevented from leaking between the second extension portion and the second clamping portions.

\* \* \* \* \*